(12) United States Patent   (10) Patent No.: US 9,207,814 B2
Yilmaz                       (45) Date of Patent:    Dec. 8, 2015

(54) SINGLE-LAYER TOUCH SENSOR

(75) Inventor: Esat Yilmaz, Santa Cruz, CA (US)

(73) Assignee: Atmel Corporation, San Jose, CA (US)

( * ) Notice: Subject to any disclaimer, the term of this patent is extended or adjusted under 35 U.S.C. 154(b) by 64 days.

(21) Appl. No.: 13/325,239

(22) Filed: Dec. 14, 2011

(65) Prior Publication Data
US 2013/0154991 A1    Jun. 20, 2013

(51) Int. Cl.
G06F 3/044    (2006.01)
H03K 17/96    (2006.01)

(52) U.S. Cl.
CPC .............. *G06F 3/044* (2013.01); *H03K 17/962* (2013.01); *G06F 2203/04103* (2013.01); *G06F 2203/04111* (2013.01); *G06F 2203/04112* (2013.01); *H03K 2017/9602* (2013.01); *H03K 2217/96066* (2013.01); *H03K 2217/960775* (2013.01)

(58) Field of Classification Search
CPC ............... G06F 3/044; G06F 3/04886; G06F 2203/04111; G06F 2203/04112; H03K 17/962; H03K 2217/960775; H03K 2217/04111; H03K 2017/9602
USPC ...................... 345/173, 174; 178/18.06, 19.03
See application file for complete search history.

(56) References Cited

U.S. PATENT DOCUMENTS

| 6,297,811 | B1 * | 10/2001 | Kent et al. ................ 345/173 |
| 7,218,124 | B1 * | 5/2007 | Mackey et al. ............ 324/660 |
| 7,663,607 | B2 | 2/2010 | Hotelling |
| 7,875,814 | B2 | 1/2011 | Chen |
| 7,920,129 | B2 | 4/2011 | Hotelling |
| 8,031,094 | B2 | 10/2011 | Hotelling |
| 8,031,174 | B2 | 10/2011 | Hamblin |
| 8,040,326 | B2 | 10/2011 | Hotelling |
| 8,049,732 | B2 | 11/2011 | Hotelling |
| 8,125,462 | B2 * | 2/2012 | Lin et al. .................... 345/173 |
| 8,179,381 | B2 | 5/2012 | Frey |
| 8,415,959 | B2 * | 4/2013 | Badaye ...................... 324/658 |
| 8,502,796 | B1 * | 8/2013 | Yilmaz ....................... 345/173 |
| 2007/0279395 | A1 * | 12/2007 | Philipp et al. ............. 345/173 |
| 2008/0007539 | A1 * | 1/2008 | Hotelling ................... 345/173 |
| 2008/0164076 | A1 * | 7/2008 | Orsley ....................... 178/18.01 |
| 2009/0194344 | A1 * | 8/2009 | Harley et al. ............. 178/18.06 |
| 2009/0315854 | A1 | 12/2009 | Matsuo |
| 2010/0059294 | A1 * | 3/2010 | Elias et al. ................ 178/18.06 |
| 2010/0302201 | A1 * | 12/2010 | Ritter et al. ............... 345/174 |
| 2010/0309167 | A1 * | 12/2010 | Nam ........................... 345/174 |
| 2012/0113047 | A1 * | 5/2012 | Hanauer et al. .......... 345/174 |
| 2012/0242588 | A1 | 9/2012 | Myers |

(Continued)

FOREIGN PATENT DOCUMENTS

WO    WO 2012/129247    9/2012

OTHER PUBLICATIONS

U.S. Appl. No. 61/454,936, filed Mar. 21, 2011, Myers.

(Continued)

*Primary Examiner* — Jonathan Horner
(74) *Attorney, Agent, or Firm* — Baker Botts L.L.P.

(57) ABSTRACT

In one embodiment, an apparatus includes a touch sensor. The touch sensor is disposed on one or more substrates. The touch sensor includes at least one drive electrode and at least one sense electrode. The drive and sense electrodes each include a base portion and a plurality of digits coupled to the base portion. The spaces between the digits of the drive electrode are partially occupied by a digit of a sense electrode (and vice versa). The drive and sense electrodes occupy the same plane.

10 Claims, 10 Drawing Sheets

(56) References Cited

U.S. PATENT DOCUMENTS

2012/0242592 A1 9/2012 Rothkopf
2012/0243151 A1 9/2012 Lynch
2012/0243719 A1 9/2012 Franklin
2012/0327012 A1* 12/2012 Hoch .......................... 345/174

OTHER PUBLICATIONS

U.S. Appl. No. 61/454,950, filed Mar. 21, 2011, Lynch.
U.S. Appl. No. 61/454,894, filed Mar. 21, 2011, Rothkopf.

* cited by examiner

SINGLE-LAYER TOUCH SENSOR

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch sensitive display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
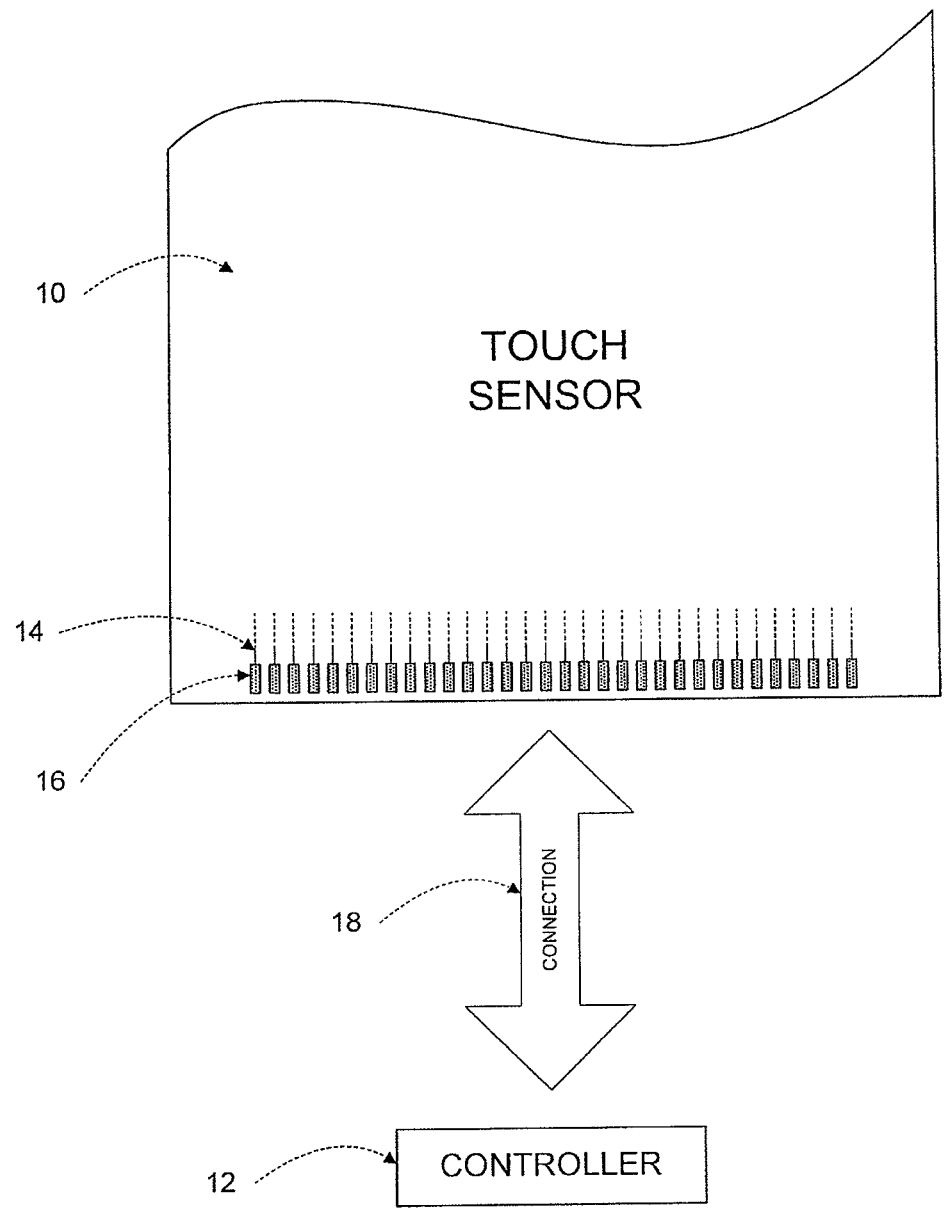
FIG. 1 illustrates an example touch sensor with an example touch-sensor controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape, where appropriate. In particular embodiments, the conductive material of an electrode may occupy substantially less than 100% (such as for example, approximately 5%) of the area of its shape. As an example and not by way of limitation, an electrode may be made of fine lines of metal or other conductive material (such as for example copper, silver, or a copper- or silver-based material) and the fine lines of conductive material may occupy substantially less than 100% (such as for example, approximately 5%) of the area of its shape in a hatched, mesh, or other suitable pattern. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fills having any suitable patterns. Where appropriate, the shapes of the electrodes (or other elements) of a touch sensor may constitute in whole or in part one or more macro-features of the touch sensor. One or more macro-features of a touch sensor may determine one or more characteristics of its functionality. One or more characteristics of the implementation of those shapes (such as, for example, the conductive materials, fills, or patterns within the shapes) may constitute in whole or in part one or more micro-features of the touch sensor. One or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 µm or less and a width of approximately 10 µm or less. As another example, one or more portions of the conductive material may be silver or silver-based and similarly have a thickness of approximately 5 µm or less and a width of approximately 10 µm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs) or digital signal processors (DSPs)) of a device that includes touch sensor 10 and touch-sensor controller 12, which may respond to the touch or proximity input by initiating a function of the device (or an application running on the device) associated with it. Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs)—such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. In particular embodiments, multiple touch-sensor controllers 12 are disposed on the FPC. In some embodiments, the FPC may have no touch-sensor controllers 12 disposed on it. The FPC may couple touch sensor 10 to a touch-sensor controller 12 located elsewhere, such as for example, on a printed circuit board of the device. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 µm or less. As another example, the conductive material of tracks 14 may be silver or silver-based and have a width of approximately 100 µm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

In particular embodiments, touch sensor 10 may have a single-layer configuration, with drive and sense electrodes disposed in a pattern on one side of a single substrate. In such a configuration, a pair of drive and sense electrodes capacitively coupled to each other across a space between them may form a capacitive node. In particular embodiments, a single-layer configuration of drive and sense electrodes may satisfy geometry and space constraints with respect to the construction of touch sensor 10. Particular embodiments and examples of single-layer configurations of drive and sense electrodes will be discussed further with respect to FIGS. 2A through 6B.

Figure 2A:
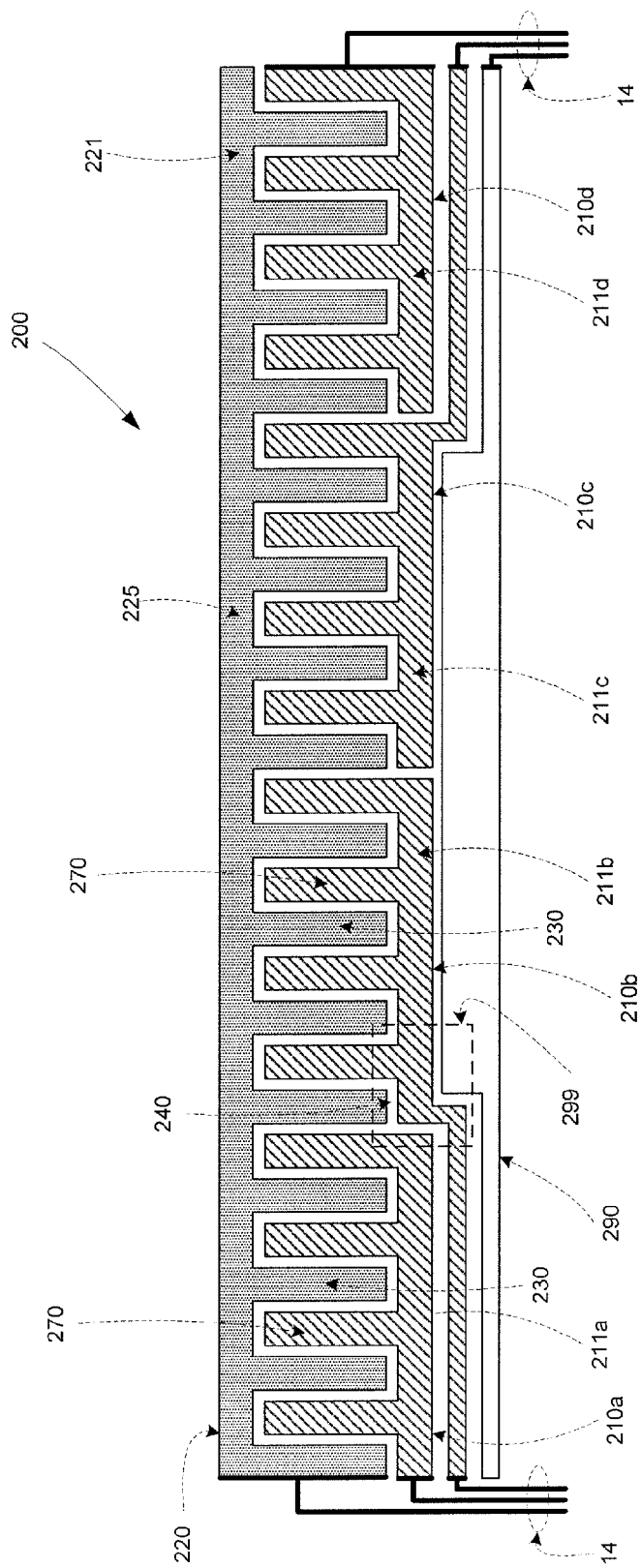
FIG. 2A illustrates an example single-layer configuration for a drive electrode and sense electrodes.

FIG. 2A illustrates an example single-layer configuration 200 for a drive electrode 220 and sense electrodes 210. In particular embodiments, single-layer configuration 200 is suitable for one-dimensional touch/proximity sensing, such as for example, in a slider. As provided by FIG. 2A, drive electrode 220 is interdigitated with sense electrodes 210 to form single-layer configuration 200. Single-layer configuration 200 is then coupled to a surface of a substrate to be included in touch sensor 10. In this manner, the drive electrode 220 and sense electrodes 210 occupy a single surface of the substrate thereby satisfying space and geometry constraints that may be associated with the design of touch sensor 10. For example, if the drive and sense electrodes had to be on different substrates, the need for two substrates would increase the thickness of the touch sensing module "stack" as compared to a stack having only one substrate. In particular embodiments, the width of gaps between adjacent electrodes is the same.

In particular embodiments, drive electrode 220 includes a plurality of digits 230. Each digit 230 has a particular length and width. In particular embodiments, each digit 230 is of substantially identical length and width. Each digit 230 extends from a base portion 221 of drive electrode 220 and is separated from a neighboring digit 230 by a space, a part of which is occupied by a digit 270 of a sense electrode 210. The base portion 221 of drive electrode 220 extends the length of single-layer configuration 200. Base portion 221 of drive electrode 220 includes connecting sections 225. Connecting sections 225 form the portions of base portion 221 that couple neighboring digits 230. In configuration 200, connecting sections 225 couple to the ends of digits 230. Drive electrode 220 couples to a track 14.

Single-layer configuration 200 includes sense electrodes 210. In the example of FIG. 2A, single-layer configuration 200 includes four sense electrodes 210a-d. In particular embodiments, each sense electrode includes a particular number of digits 270. Each digit 270 extends from a base portion 211 of a sense electrode 210. Digits 270 occupy part of the space that separates digits 230 of drive electrode 220. In particular embodiments, the base portions 211 of sense electrodes 210 and digits 270 capacitively couple to the base portion 221 of drive electrode 220 and digits 230 across a space 240 to provide a touch/proximity sensor that, with a controller 12, can sense the location of fingers and/or objects that touch and/or in proximity to touch sensor 10. A plurality of sense electrodes 210 are configured in a pattern across single-layer configuration 200. As an example and not by way of limitation, four sense electrodes 210a-d are positioned across single-layer configuration 200. Each sense electrode 210a-d includes the same number of digits 270. The base portions of sense electrodes 210a-d are of similar lengths and are spaced evenly across single-layer configuration 200.

Sense electrodes 210 are coupled to tracks 14. In particular embodiments, sense electrodes 210 couple to tracks 14 along the edges of single-layer configuration 200. As an example and not by way of limitation, tracks 14 for sense electrodes 210 are along the left edge of single-layer configuration 200 and the right edge of single-layer configuration 200. Sense electrodes 210 along the left side of single-layer configuration 200 such as, for example sense electrodes 210a and 210b, couple to tracks 14 along the left edge of single-layer configuration 200. Sense electrodes 210 on the right side of single-layer configuration 200 such as, for example sense electrodes 210c and 210d, couple to tracks 14 along the right edge of single-layer configuration 200. In particular embodiments, vias or insulated bridges are used to route tracks 14 coupled to sense electrodes 210 along the top edge of single-layer configuration 200. Vias are openings made through the substrate, through which the tracks 14 can pass, so that they can continue along the opposite surface of the substrate from the electrodes. Insulated bridges are portions of dielectric or insulating material that are used at locations where a track intersects with other conductive elements to prevent direct electrical contact of the track with the other conductive element.

In particular embodiments, single-layer configuration 200 includes a ground line 290 through which drive electrodes 220 and sense electrodes 210 capacitively couple to ground. Ground line 290 couples to a track 14 along an edge of single-layer configuration 200.

In particular embodiments, by having sense electrodes 210 similarly shaped and evenly arranged across single-layer configuration 200, linearity of single-layer configuration 200 is preserved across single-layer configuration 200. Because each sense electrode 210 is of similar width and includes the same number of digits 270, tracks 14 for a particular sense electrode 210 is similar to tracking for another sense electrode 210. This linearity makes it easier for touch-sensor controller 12 to detect a touch or an object near touch sensor 10.

Figure 2B:
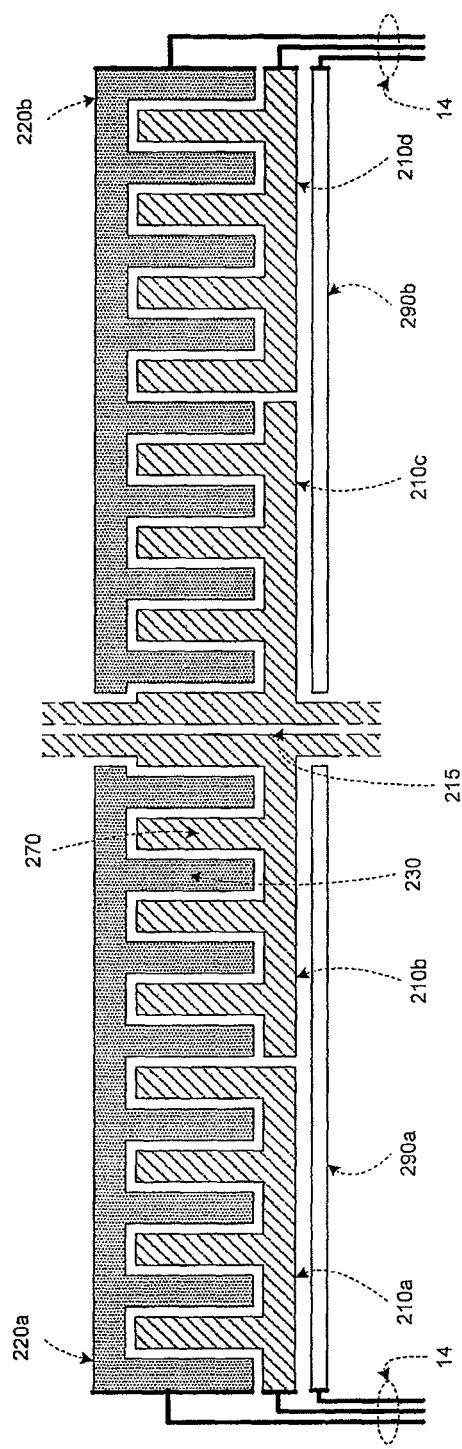
FIG. 2B illustrates an example single-layer configuration for drive electrodes and sense electrodes.

FIG. 2B illustrates an example single-layer configuration 200 for drive electrodes 220 and sense electrodes 210. As provided by FIG. 2B, drive electrodes 220 and sense electrodes 210 are symmetrically configured about a spine 215. In general, drive electrodes 220 and sense electrodes 210 are symmetrically configured about spine 215 on a single surface of a substrate, which satisfies geometry and space constraints that arise during the construction of touch sensor 10. Furthermore, spine 215 provides additional space through which tracks 14 may run.

In a symmetric arrangement, drive electrodes 220a and 220b are arranged opposite each other across spine 215. Drive electrodes 220a and 220b include the same number of digits 230. Each digit 230 is separated from another digit 230 by a space partially filled by a digit 270 of a sense electrode 210. Drive electrodes 220a and 220b couple to tracks 14 on opposite ends of single-layer configuration 200. As an example and not by way of limitation, a track 14 couples to drive electrode 220 along the left edge of single-layer configuration 200 while another track 14 couples to drive electrode 220b along the right edge of single-layer configuration 200.

Drive electrodes 220a and 220b are capacitively coupled to sense electrodes 210 across a space between them. Sense electrodes 210 are also arranged symmetrically about spine 215. In particular embodiments, spine 215 is a space defined by two adjacent sense electrodes 210. As an example and not by way of limitation, sense electrode 210b and sense electrode 210c define a space between them that is spine 215. As an example and not by way of limitation, sense electrode 210a is placed on one side of spine 215 and sense electrode 210d is placed on the opposite side of spine 215 such that sense electrode 210a and sense electrode 210d are approximately equidistant from spine 215. Sense electrode 210a is of similar shape to sense electrode 210d. As illustrated in FIG. 2B, sense electrode 210a resembles a reflection of sense electrode 210d. As another example and not by way of limitation, sense electrode 210b is placed on one side of spine 215 and sense electrode 210c is placed on the opposite side of spine 215 such that sense electrodes 210b and 210c are approximately equidistance from spine 215. Sense electrode 210b is of similar shape to sense electrode 210c. As illustrated in FIG. 2B, sense electrode 210b resembles a reflection of sense electrode 210c.

Sense electrodes 210 couple to tracks 14. Particular sense electrodes 210 couple to tracks 14 along an edge of single-layer configuration 200. As an example and not by way of limitation, sense electrode 210a couples to track 14 along the left edge of single-layer configuration 200. Sense electrode 210d couple to track 14 along the right edge of single-layer configuration 200. Some sense electrodes 210 couple to tracks 14 through spine 215. As an example and not by way of limitation, tracks 14 run through spine 215 and couple to sense electrodes 210b and 210c.

Single-layer configuration 200 includes ground lines 290a and 290b that capacitively couple drive electrodes 220 and sense electrodes 210 to ground. If included, as illustrated in FIG. 2B, ground lines 290a and 290b are arranged symmetrically about spine 215. Tracks 14 couple to ground lines 290a and 290b along edges of single-layer configuration 200. As an example and not by way of limitation, track 14 couples to ground line 290a along the left edge of single-layer configuration 200 and track 14 couples to ground line 290b along the right edge of single-layer configuration 200.

Figure 3A:
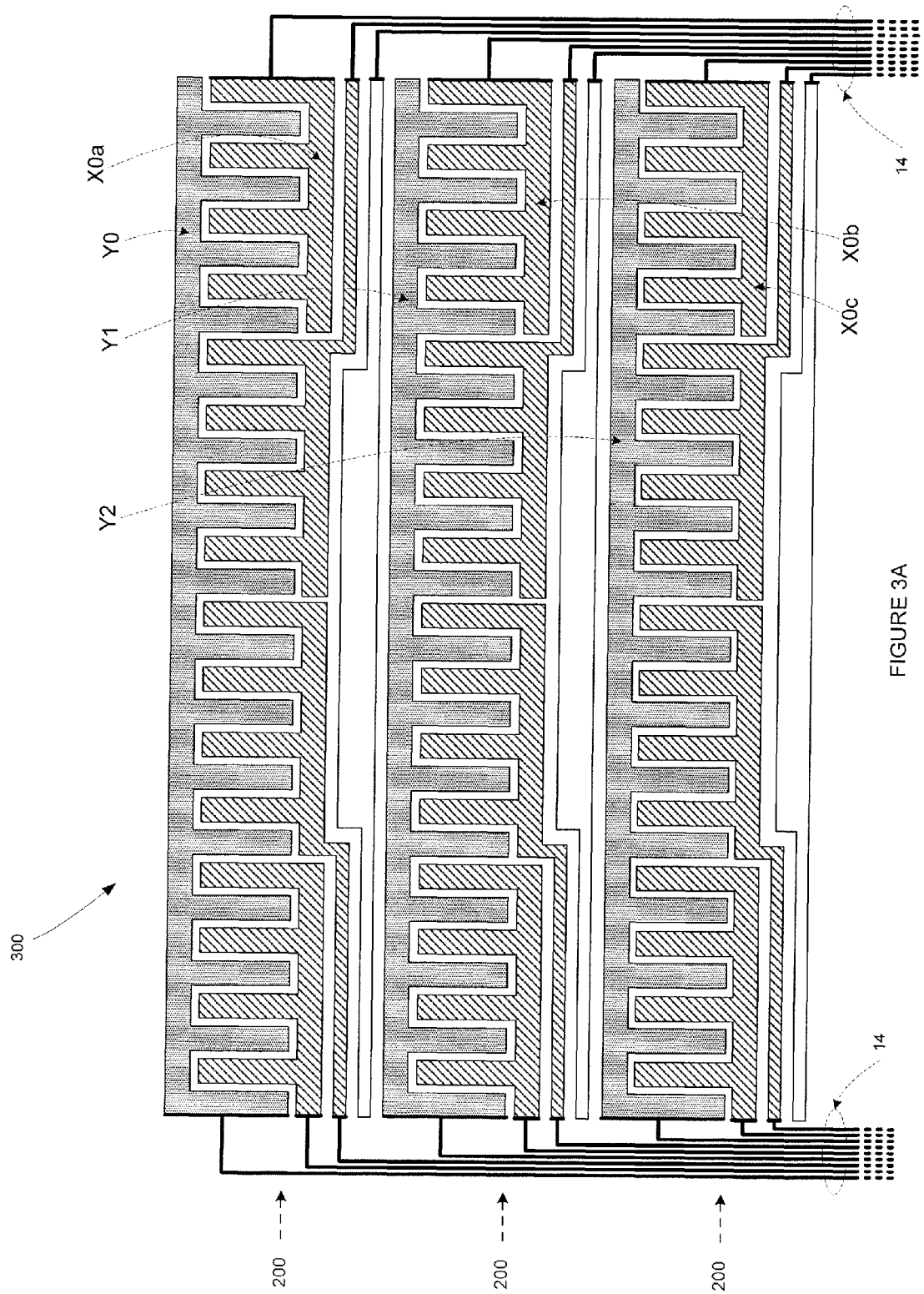
FIG. 3A illustrates an example single-layer configuration of drive and sense electrodes using the example configuration of FIG. 2A.

FIG. 3A illustrates an example single-layer configuration 300 of drive and sense electrodes using the example configuration 200 of FIG. 2A. In particular embodiments, single-layer configuration 300 is suitable for two-dimensional touch/proximity sensing, such as for example, in a touch screen. As provided by FIG. 3A, a plurality of single-layer configurations 200 are arranged vertically to form single-layer configuration 300. As an example and not by way of limitation, first single-layer configuration 200a is positioned above second single-layer configuration 200b, which is positioned above third single-layer configuration 200c to form single-layer configuration 300.

In particular embodiments, tracks 14 coupled to each single-layer configuration 200 are arranged along the edges of single-layer configuration 300. Each drive electrode 220 and sense electrode 210 couple to a track 14. In particular embodiments, drive electrodes 220 share a track 14 and similarly positioned sense electrodes 210 in each single-layer configuration 200 share a track 14.

Figure 3B:
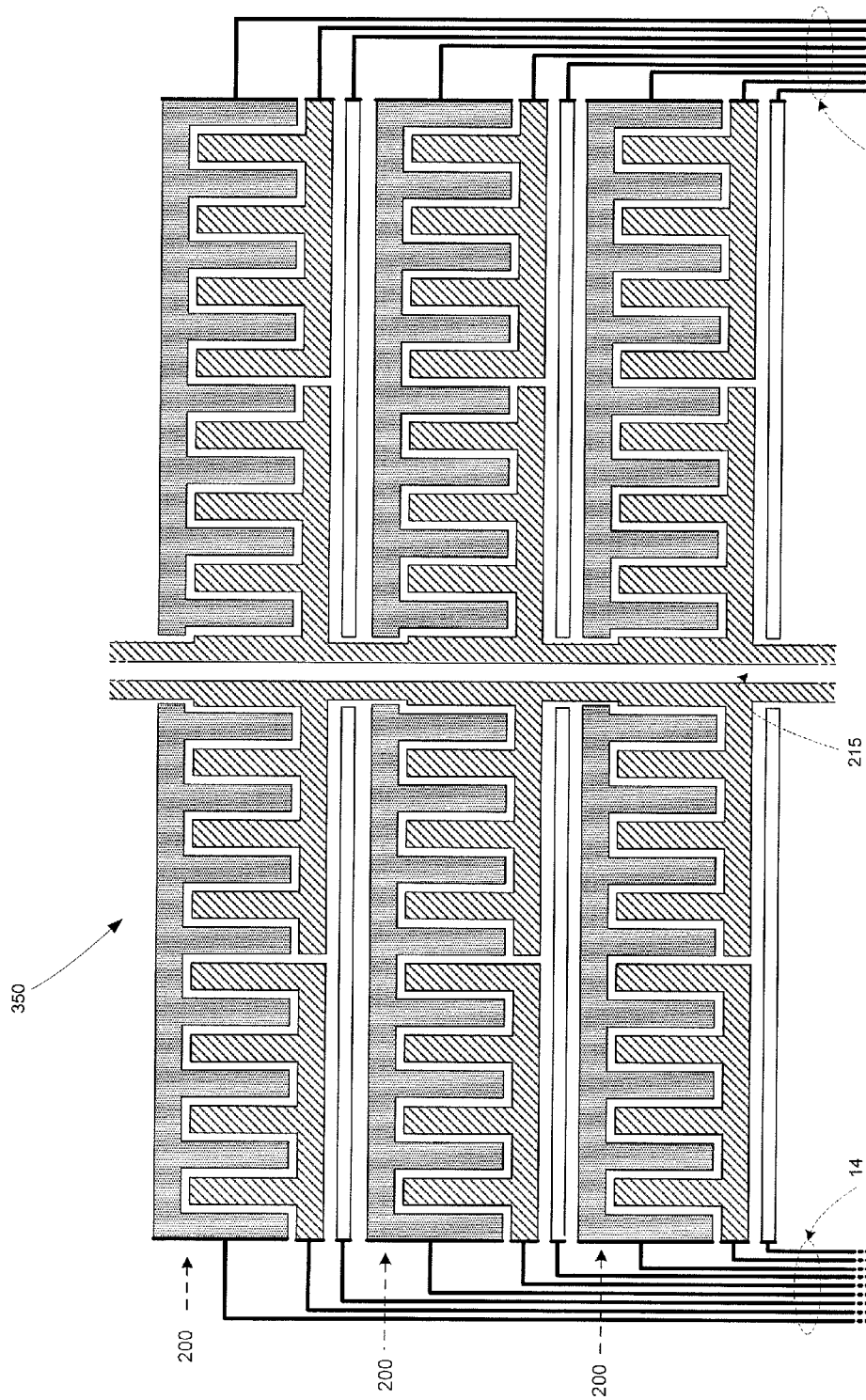
FIG. 3B illustrates an example single-layer configuration of drive and sense electrodes using the example configuration of FIG. 2B.

FIG. 3B illustrates an example single-layer configuration 350 of drive and sense electrodes using the example configuration 200 of FIG. 2B. As provided by FIG. 3B, a plurality of single-layer configurations 200 are arranged to form single-layer configuration 350. As an example and not by way of limitation, first single-layer configuration 200 is arranged above second single-layer configuration 200 which is arranged above third single-layer configuration 200 to form single-layer configuration 350. Each single-layer configuration 200 includes a spine 215. In particular embodiments, spines 215 from each single-layer configuration 200 define a larger spine 215. The sense electrodes 210 along spine 215 couple to other sense electrodes 210 that run along spine 215.

Tracks 14 couple to drive and sense electrodes along the edges of single-layer configuration 350. As an example and not by way of limitation, drive electrodes 220 and sense electrodes 210 arranged on the left side of single-layer configuration 350 couple to tracks 14 that run along the left edge of single-layer configuration 350. Drive electrodes 220 and sense electrodes 210 arranged on the right side of single-layer configuration 350 couple to tracks 14 that run along the right edge of single-layer configuration 350. In particular embodiments, tracks 14 additionally run through spine 215 to couple to sense electrodes 210 that run along spine 215. In particular embodiments, drive electrodes 220 arranged on a particular side of single-layer configuration 350 share a track 14. Similarly, sense electrodes 210 that are similarly arranged on a particular side of single-layer configuration 350 share a track 14. As an example and not by way of limitation, by using vias or insulated bridges, tracks 14 for the various electrode segments in one column (e.g. X0a, X0b, and X0c) can be coupled to a single vertical track 210 for that column, which would allow for narrower width of overall area for tracks 210. This further allows for wider tracks 210, which reduces impedance, or wider sensing area.

Figure 4A:
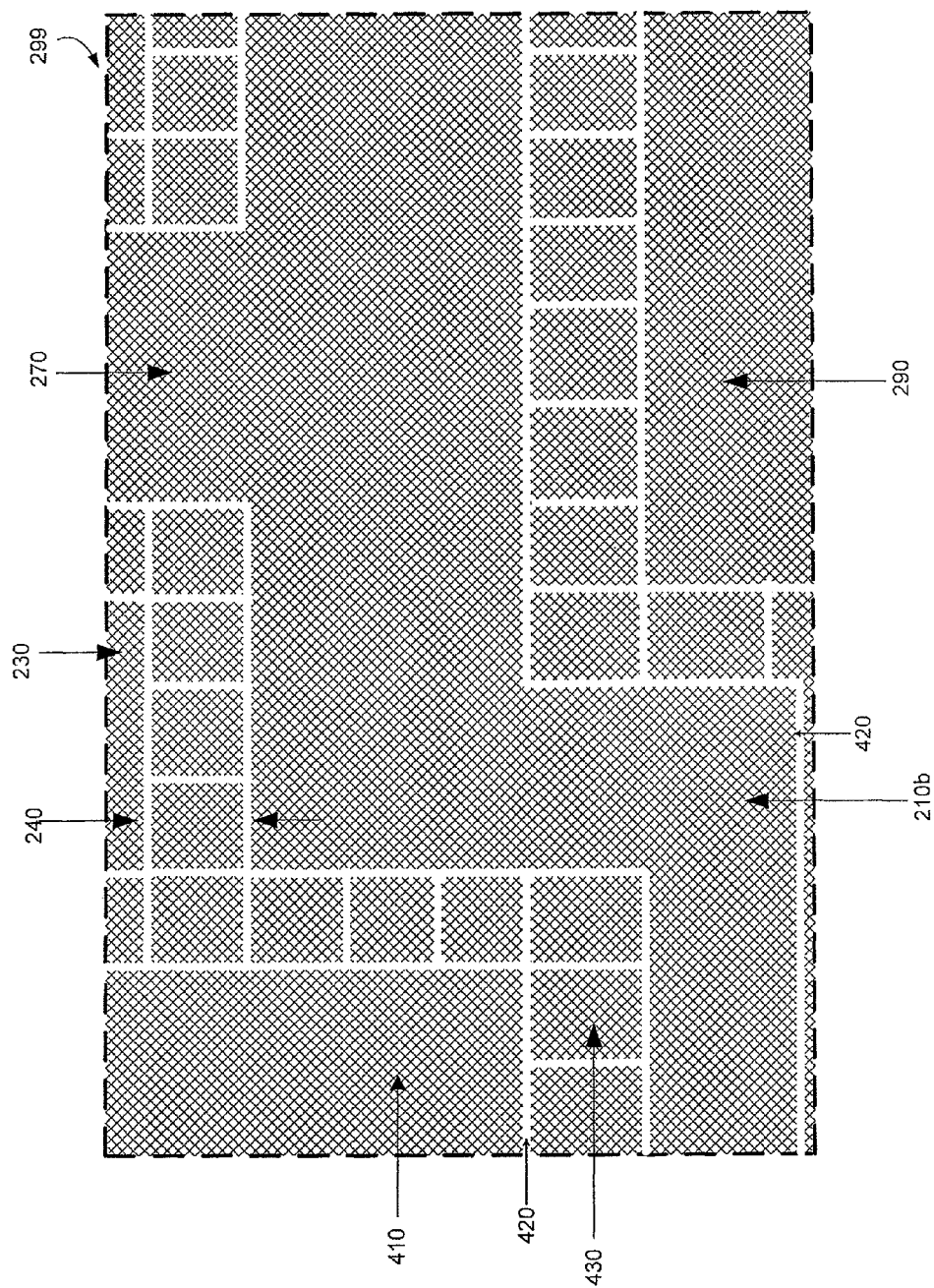
FIG. 4A illustrates an example conductive mesh, which in a particular embodiment, forms a portion of the example configuration of FIG. 2A.

FIG. 4A illustrates an example conductive mesh 410, which in a particular embodiment, forms a portion 299 of the example configuration 200 of FIG. 2A. As provided by FIG. 4A, mesh 410 may define channels 420 that define the arrangement of drive electrodes 220 and sense electrodes 210 in configuration 200. In general, mesh 410 is made of a conductive material such as fine lines of metal. When no channels 420 are defined by mesh 410, electric current can flow throughout mesh 410. Channels 420 electrically isolate certain portions of mesh 410 from other portions of mesh 410. In this manner, channels 420 may be used to form sense electrodes 210, drive electrode 220, and space 240.

As illustrated in FIG. 4A, portion 299 includes sense electrodes 210a and 210b. Channels 420 electrically isolate sense electrodes 210a and 210b from other portions of mesh 410. Channels 420 also electrically isolate drive electrode 220 from other portions of mesh 210. As further illustrated in FIG. 4A, channels 420 define space 240 across which drive electrode 220 and sense electrodes 210 capacitively couple. In particular embodiments, mesh 410 defines additional channels 420 in the region defined by space 240 to form squares 430. Squares 430 occupy a portion of space 240. Channels 420 physically and electrically isolate squares 430 from the rest of mesh 410. Squares 430 improve the visual effect of touch sensor 10 formed using mesh 410.

Figure 4B:
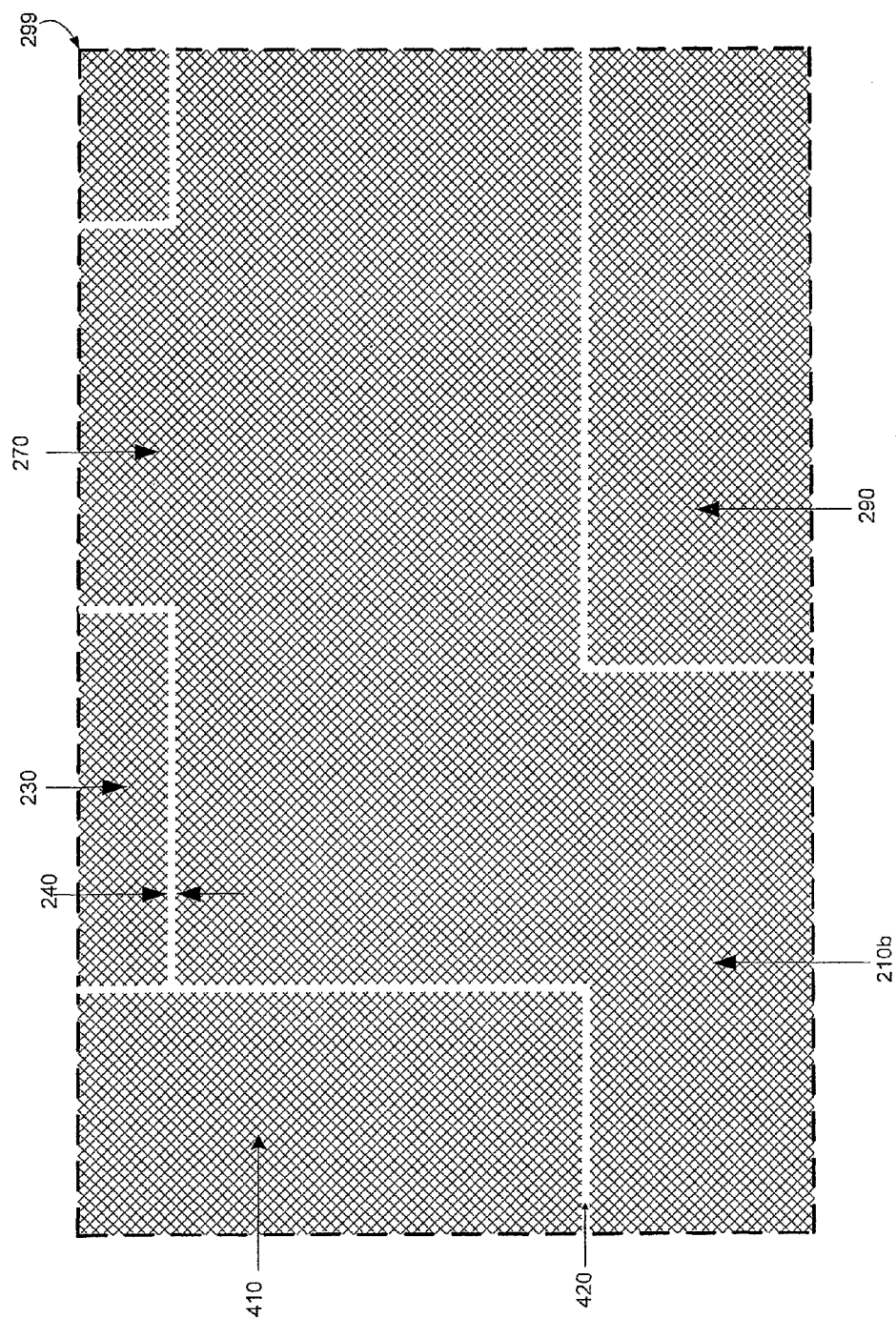
FIG. 4B illustrates an example conductive mesh, which in a particular embodiment, forms a portion of the example configuration of FIG. 2A.

FIG. 4B illustrates an example conductive mesh 410, which in a particular embodiment, forms a portion 299 of the example configuration 200 of FIG. 2A. As provided by FIG. 4B, space 240 is defined by a channel 420. As a result, drive electrode 220 and sense electrodes 210 capacitively couple to each other across channel 420. In particular embodiments, by defining channels 420 in this manner, mesh 410 is more efficiently used and fewer channels 420 need to be defined to form single-layer configuration 200 thus saving time and materials during construction of touch sensor 10.

Figure 5:
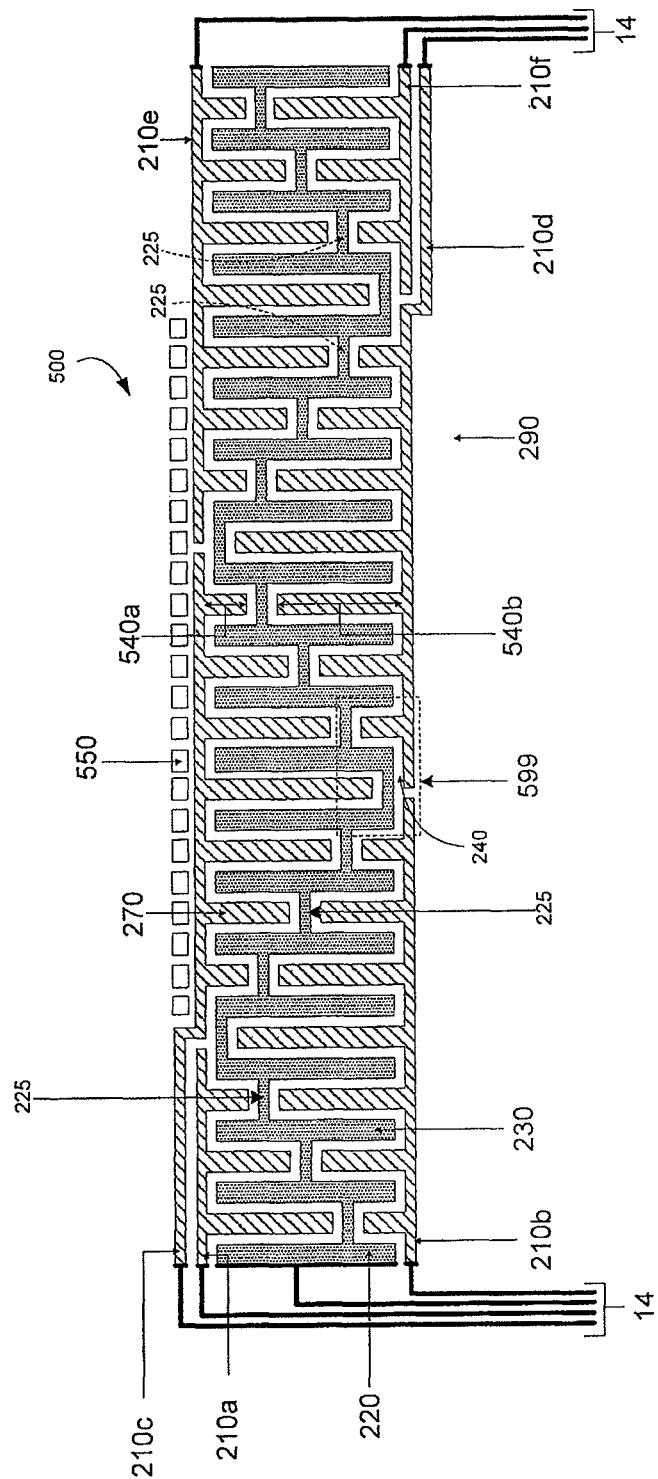
FIG. 5 illustrates an example single-layer configuration for a drive electrode and sense electrodes.

FIG. 5 illustrates an example single-layer configuration 500 for a drive electrode 220 and sense electrodes 210. As provided by FIG. 5, drive electrodes 220 and sense electrodes 210 are not arranged uniformly across single-layer configuration 500. As an example and not by way of limitation, the position at which adjacent digits 230 couple to one another varies in terms of vertical position across single-layer configuration 500. Connecting sections 225 couple adjacent digits 230 as in configuration 200 of FIG. 2A, however, the connecting sections 225 in configuration 500, the vertical position at which connecting sections 225 couple to digits 230 varies across configuration 500. For example, a particular digit 230 couples to a connecting section 225 on its left edge and on its right edge. However, the connecting section 225 on the left edge of digit 230 can couple to digit 230 at a higher or lower position than the connecting section 225 on the right edge of digit 230. Accordingly, the coupling of adjacent digits 230 leads to non-uniform distributions and patterns across configuration 500. As an example and not by way of limitation, the coupling of adjacent digits 230 leads to a triangular pattern across single-layer configuration 500. A particular digit 230 couples at its midpoint to a first adjacent digit 230, and the particular digit 230 couples at a point below its midpoint to a second adjacent digit 230. The varying position at which particular digits 230 couple to adjacent digits 230 define the triangular pattern.

In particular embodiments, the varying position at which particular digits 230 couple to adjacent digits 230 results in digits 270 of sense electrodes 210 having various lengths across single-layer configuration 500. The varied lengths correspond with a triangular pattern. In particular embodiments, the space between two digits 230 of drive electrode 220 is partially occupied by a pair of digits 270. First digit 270 has a first length 540a and the second digit 270 has a second length 540b. When a touch or an object is near touch sensor 10, the ratio of first length 540a to second length 540b is used to determine the location of the touch or object. As an example and not by way of limitation, a touch occurs on an area of touch sensor 10 near a first digit 270 of a first sense electrode 210 and a second digit 270 of a second sense electrode 210. As a result, the touch sensor 10 detects a first capacitance change associated with the first sense electrode 210 and a second capacitance change associated with the second sense electrode 210. By comparing the ratio of the first capacitance change to the second capacitance change to the ratios of the lengths of the digits 270 associated with the first sense electrode 210 and the second sense electrode 210, it is possible to determine the location of the touch.

Configuration 500 includes conductors 550 located along the top of configuration 500. Each conductor 550 is electrically isolated from other portions of configuration 500. When configuration 500 is stacked upon itself to form a single-layer configuration (analogous to using configuration 200 to form single-layer configuration 300 of FIG. 3A), conductors 550 will fill in an open space that would otherwise be created. By locating conductors 550 along the top of configuration 500, the open space will be filled thus improving the visual effect of touch sensor 10.

Figure 6A:
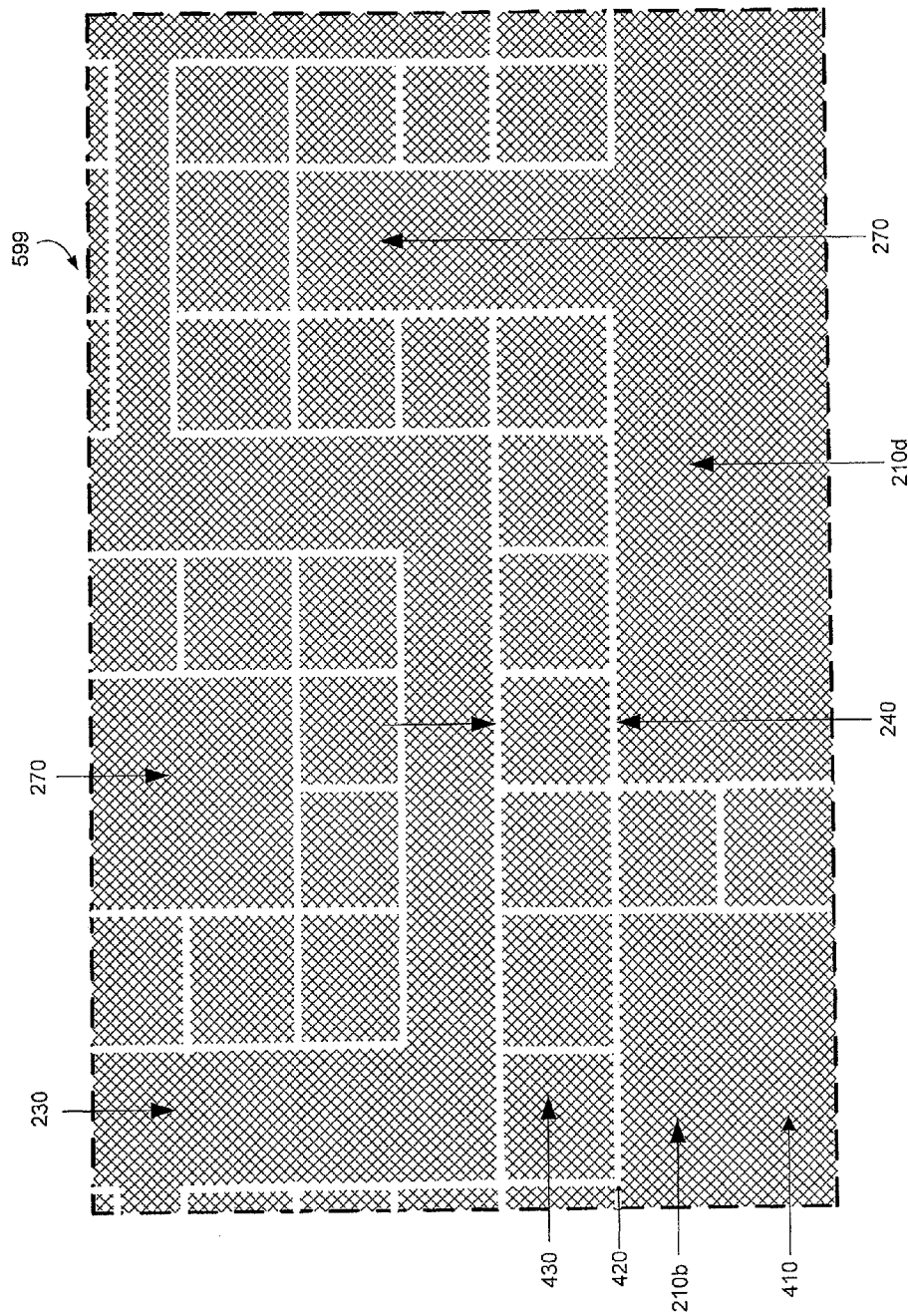
FIG. 6A illustrates an example conductive mesh, which in particular embodiments, forms a portion of the example configuration of FIG. 5.

FIG. 6A illustrates an example conductive mesh 410, which in particular embodiments, forms a portion 599 of the example configuration 500 of FIG. 5. As provided by FIG. 6A, mesh 410 defines channels 420 that define the drive electrodes 220 and sense electrodes 210 of single-layer configuration 500. Channels 420 electrically isolate the drive electrode 220 from the sense electrodes 210. Similar to the illustration of FIG. 4A, channels 420 define space 240 across which drive electrodes 220 and sense electrodes 210 capacitively couple. Additional channels 420 form squares 430, which are physically and electrically isolated by channels 420 from other parts of mesh 410. In particular embodiments, squares 430 improve the visual effect of touch sensor 10.

Figure 6B:
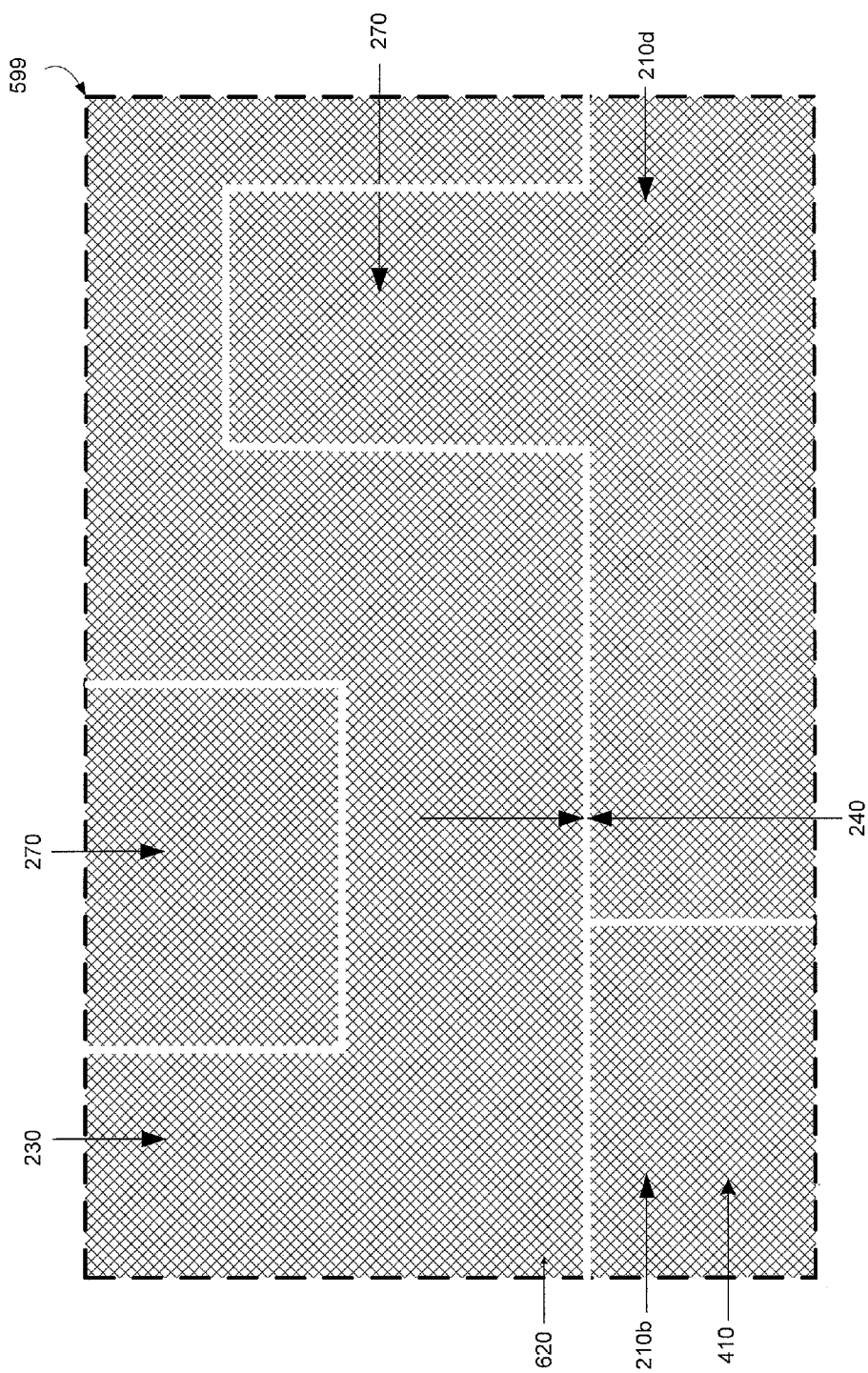
FIG. 6B illustrates another example conductive mesh, which in particular embodiments, forms a portion of the example configuration of FIG. 5.

FIG. 6B illustrates another example conductive mesh 410, which in particular embodiments, forms a portion 599 of the example configuration 500 of FIG. 5. As provided by FIG. 6B, space 240 is defined by a cut 620. As a result, drive electrode 220 and sense electrodes 210 capacitively couple to each other across cut 620. In particular embodiments, capacitively coupling drive electrode 220 to sense electrodes 210 across cut 620 provides more efficient usage of mesh 410 and further saves time and materials during the construction of touch sensor 10. Defining space 240 by cut 620 further results in thinner separation features through the removal of squares 430. The thinner separation features result in different spacing from FIG. 6A such that certain features in the portion 599 of FIG. 6A do not appear in the portion 599 of FIG. 6B. As an example and not by way of limitation, the top right of portion 599 in FIG. 6A includes channels 240 while the top right of portion 599 in FIG. 6B does not.

Although this disclosure describes making cuts 420 into mesh 410 to form particular configurations, this disclosure contemplates making cuts 420 into mesh 410 to form any suitable configuration. Although this disclosure describes single-layer configuration 200 including a particular number of drive electrodes 220 configured in a particular manner, this disclosure contemplates single-layer configuration including any suitable number of drive electrodes 220 configured in any suitable manner.

Although this disclosures describes single-layer configuration 200 including a particular number of sense electrodes 210, this disclosure contemplates single-layer configuration 200 including any suitable number of sense electrodes 210. Although this disclosure describes single-layer configuration 200 including a particular number of sense electrodes 210 with a particular number of digits 270 configured in a particular manner, this disclosure contemplates single-layer configuration 200 including any suitable number of sense electrodes 210 with any suitable number of digits 270 and configured in any suitable manner. Although this disclosure describes single-layer configuration 200 including tracks 14 arranged in a particular manner, this disclosure contemplates single-layer configuration 200 including tracks 14 arranged in any particular manner. Although this disclosure describes single-layer configuration 200 including a ground line 290 configured in a particular manner, this disclosure contemplates single-layer configuration 200 including a ground line 290 configured in any particular manner.

Although this disclosure describes tracks 14 coupling to drive electrodes 220a and 220b in a particular manner, this disclosure contemplates tracks 14 coupling to drive electrodes 220a and 220b in any suitable manner. Although this disclosure describes drive electrodes 220 configured in a particular manner, this disclosure contemplates drive electrodes 220 configured in any suitable manner. Although this disclosure describes sense electrodes 210a-d arranged in a particular manner across single-layer configuration 200, this disclosure contemplates arranging sense electrodes 210a-d in any suitable manner across single-layer configuration 200. Although this disclosure describes sense electrodes 210 coupling to tracks 14 in a particular manner, this disclosure contemplates sense electrodes 210 coupling to tracks 14 in any suitable manner. Although this disclosure describes single-layer configuration 200 including a particular number of ground lines 290 arranged in a particular manner, this disclosure contemplates a single-layer configuration 200 including any suitable number of ground lines 290 arranged in any suitable manner. Although this disclosure describes single-layer configuration 300 being formed from a particular number of single-layer configurations 200 arranged in a particular manner, this disclosure contemplates single-layer configuration 300 being formed from any suitable number of single-layer configurations 200 arranged in any suitable manner. Although this disclosure describes tracks 14 arranged in a particular manner, this disclosure contemplates tracks 14 arranged in any suitable manner.

Although this disclosure describes tracks 14 arranged in a particular manner, this disclosure contemplates tracks 14 arranged in any suitable manner. Although FIG. 4A illustrates using channels 420 in mesh 410 to form a portion 299 of single-layer configuration 200, this disclosure contemplates using channels 420 in mesh 410 to form the arrangement of drive electrodes 220 and sense electrodes 210 in single-layer configuration 200. Although this disclosure describes defining channels 420 to form particular configurations, this disclosure contemplates defining channels 420 to form any suitable configuration.

Although this disclosure describes a particular digit 230 coupling to adjacent digits 230 at particular points, this disclosure contemplates any suitable digit 230 coupling to adjacent digits 230 at any suitable points. Although this disclosure describes drive electrode 220 and sense electrodes 210 arranged in a particular manner across single-layer configuration 500, this disclosure contemplates drive electrode 220 and sense electrodes 210 being arranged in any suitable manner across single-layer configuration 500.

Although FIG. 6A illustrates mesh 410 defining channels 420 that form a portion 599 of configuration 500, this disclosure contemplates defining channels 420 that form the arrangement of drive electrode 220 and the sense electrodes 210 of configuration 500.

Although this disclosure illustrates several configurations of touch sensor 10, these illustrations are not necessarily drawn to scale. Certain features have been exaggerated or enlarged for descriptive purposes. For example, in particular illustrations, the size of the spacing between digits in proportion to the size of the digits has been increased to properly describe the spacing between digits. Although this disclosure illustrates the spacing between digits being of particular sizes, this disclosure contemplates the spacing between digits being of any suitable size. The spacing between digits may be uniform across any particular configuration or the spacing between digits may be non-uniform across any particular configuration.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a secure digital card, a secure digital drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus comprising:
   a touch sensor disposed on one or more substrates, the touch sensor comprising:
   a first drive electrode and a second drive electrode made of conductive material;
   a first sense electrode, a second sense electrode, and a third sense electrode made of conductive material, wherein the first, second, and third sense electrodes are nonintersecting with the first and second drive electrodes; and
   a spine defined by the first and second sense electrodes, wherein the first and second drive electrodes are symmetrically configured about the spine, and wherein the first and second sense electrodes are symmetrically configured about the spine;
   the first drive electrode comprising:
      a first base portion; and
      a plurality of first digits coupled to the first base portion, each of the first digits being separated from another digit coupled to the first base portion by a first space;
   the second drive electrode comprising:
      a second base portion; and
      a plurality of second digits coupled to the second base portion, each of the second digits being separated from another digit coupled to the second base portion by a second space;
   the first sense electrode comprising:
      a third base portion; and
      a plurality of third digits coupled to the third base portion, each of the third digits being separated from another digit coupled to the third base portion by a third space;
   the second sense electrode comprising:
      a fourth base portion; and
      a plurality of fourth digits coupled to the fourth base portion, each of the fourth digits being separated from another digit coupled to the fourth base portion by a fourth space; and
   the third sense electrode comprising:
      a fifth base portion; and
      a plurality of fifth digits coupled to the fifth base portion, each of the fifth digits being separated from another digit coupled to the fifth base portion by a fifth space;
   wherein:
      a portion of each of the third spaces is occupied by a portion of one of the first digits;
      a portion of each of the fourth spaces is occupied by a portion of one of the second digits;
      a portion of each of the fifth spaces is occupied by a portion of one of the second digits;
      a portion of each of the first spaces is occupied by a portion of one of the third digits;
      a portion of each of the fourth digits occupies a portion of one of the second spaces;
      a portion of each of the fifth digits occupies a portion of one of the second spaces;
      the first and second drive electrodes and the first, second, and third sense electrodes occupy the same plane; and
      the second and third sense electrodes are on the same side of the second base portion.

2. The apparatus of claim 1 wherein each first digit is of uniform length across the touch sensor, and each second digit and each third digit are of uniform length across the touch sensor.

3. The apparatus of claim 1 wherein the at least one drive electrode and the first and second sense electrodes are formed from a conductive mesh.

4. The apparatus of claim 3 wherein the conductive mesh defines channels that define the at least one drive electrode and the first and second sense electrodes.

5. The apparatus of claim 1 wherein the lengths of the second digits and the third digits are nonuniform to form a triangular pattern across the touch sensor.

6. An apparatus comprising:
   a touch sensor disposed on one or more substrates, the touch sensor comprising:
   a first drive electrode and a second drive electrode made of conductive material;
   a first sense electrode, a second sense electrode, and a third sense electrode made of conductive material, wherein the first, second, and third sense electrodes are nonintersecting with the first and second drive electrodes; and
   a spine defined by the first and second sense electrodes, wherein the first and second drive electrodes are symmetrically configured about the spine, and wherein the first and second sense electrodes are symmetrically configured about the spine;

the first drive electrode comprising:
- a first base portion; and
- a plurality of first digits coupled to the first base portion, each of the first digits being separated from another digit coupled to the first base portion by a first space;

the second drive electrode comprising:
- a second base portion; and
- a plurality of second digits coupled to the second base portion, each of the second digits being separated from another digit coupled to the second base portion by a second space;

the first sense electrode comprising:
- a third base portion; and
- a plurality of third digits coupled to the third base portion, each of the third digits being separated from another digit coupled to the third base portion by a third space; and the second sense electrode comprising:
- a fourth base portion; and
- a plurality of fourth digits coupled to the fourth base portion, each of the fourth digits being separated from another digit coupled to the fourth base portion by a fourth space;

the third sense electrode comprising:
- a fifth base portion; and
- a plurality of fifth digits coupled to the fifth base portion, each of the fifth digits being separated from another digit coupled to the fifth base portion by a fifth space wherein:
- a portion of each of the third spaces is occupied by a portion of one of the first digits;
- a portion of each of the first spaces is occupied by a portion of one of the third digits;
- a portion of each of the fourth and fifth spaces is occupied by a portion of one of the second digits;
- a portion of each of the second spaces is occupied by at least one of a portion of one of the fourth digits and a portion of one of the fifth digits;
- the first and second drive electrodes and the first, second, and third sense electrodes occupy the same plane;
- the second and third sense electrodes are on the same side of the second base portion.

7. The apparatus of claim 6 wherein each first digit is of uniform length across the touch sensor, and each second digit and each third digit are of uniform length across the touch sensor.

8. The apparatus of claim 6 wherein the at least one drive electrode and the first and second sense electrodes are formed from a conductive mesh.

9. The apparatus of claim 8 wherein the conductive mesh defines channels that define the at least one drive electrode and the first and second sense electrodes.

10. The apparatus of claim 6 wherein the lengths of the second digits and the third digits are nonuniform to form a triangular pattern across the touch sensor.

* * * * *

UNITED STATES PATENT AND TRADEMARK OFFICE
CERTIFICATE OF CORRECTION

| | |
|---|---|
| PATENT NO. | : 9,207,814 B2 |
| APPLICATION NO. | : 13/325239 |
| DATED | : December 8, 2015 |
| INVENTOR(S) | : Yilmaz |

Page 1 of 1

It is certified that error appears in the above-identified patent and that said Letters Patent is hereby corrected as shown below:

In the claims

Col. 15, Ln. 21 claim 6: After "fourth" and before "being" delete "di its," and insert --digits,--.

Signed and Sealed this
Twenty-ninth Day of March, 2016

Michelle K. Lee
*Director of the United States Patent and Trademark Office*